United States Patent
Takada et al.

(10) Patent No.: US 8,432,066 B2
(45) Date of Patent: Apr. 30, 2013

(54) NON-CONTACT POWER TRANSMISSION APPARATUS AND METHOD FOR DESIGNING NON-CONTACT POWER TRANSMISSION APPARATUS

(75) Inventors: Kazuyoshi Takada, Kariya (JP); Sadanori Suzuki, Kariya (JP); Kenichi Nakata, Kariya (JP); Shimpei Sakoda, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 669 days.

(21) Appl. No.: 12/611,508

(22) Filed: Nov. 3, 2009

(65) Prior Publication Data

US 2010/0115474 A1 May 6, 2010

(30) Foreign Application Priority Data

Nov. 4, 2008 (JP) .................. 2008-283563

(51) Int. Cl.
*H01F 27/42* (2006.01)
*H01F 38/00* (2006.01)

(52) U.S. Cl.
USPC ........................................ 307/104

(58) Field of Classification Search .............. 307/104; 324/756.06
See application file for complete search history.

(56) References Cited

U.S. PATENT DOCUMENTS

| 2007/0222542 | A1 | 9/2007 | Joannopoulos |
| 2008/0278264 | A1 | 11/2008 | Karalis |
| 2011/0231029 | A1* | 9/2011 | Ichikawa et al. ............. 700/298 |

FOREIGN PATENT DOCUMENTS

| JP | 2008-125198 A | 5/2008 |
| WO | WO2007/008646 A2 | 1/2007 |
| WO | WO2008/118178 A1 | 10/2008 |
| WO | WO2009/054221 A1 | 4/2009 |

OTHER PUBLICATIONS

"Wireless Power Transfer Via Strongly Coupled Magnetic Resonances" Science Magazine vol. 317, Jul. 6, 2007, p. 83-86.
Soljacic, et al., "*Nikkei Electronics*", Dec. 3, 2007, 966, 117-128.

* cited by examiner

*Primary Examiner* — Rexford Barnie
*Assistant Examiner* — Dru Parries
(74) *Attorney, Agent, or Firm* — Woodcock Washburn LLP

(57) ABSTRACT

A non-contact power transmission apparatus having a resonance system is disclosed. The resonance system includes a primary coil to which an alternating-current voltage from an alternating-current source is applied, a primary-side resonance coil, a secondary-side resonance coil, and a secondary coil to which a load is connected. The impedance of the primary coil is set such that the output impedance of the alternating-current source and the input impedance of the resonance system are matched to each other.

6 Claims, 3 Drawing Sheets

NON-CONTACT POWER TRANSMISSION APPARATUS AND METHOD FOR DESIGNING NON-CONTACT POWER TRANSMISSION APPARATUS

CROSS REFERENCE TO RELATED APPLICATION

This application claims priority to Japanese Patent Application No. 2008-283563 filed Nov. 4, 2008.

BACKGROUND

The present invention relates to a non-contact power transmission apparatus and a method for designing a non-contact power transmission apparatus.

FIG. 6 schematically shows a non-contact power transmission apparatus that transmits power from a first copper coil 51 to a second copper coil 52 placed at a distance from the first copper coil 51 by means of resonance of electromagnetic fields. Such apparatuses are disclosed, for example, in NIKKEI ELECTRONICS 2007.12.3 Issue, pages 117 to 128, and International Patent Publication WO/2007/008646. In FIG. 6, a magnetic field generated at a primary coil 54 connected to an alternating-current source 53 is intensified by means of magnetic field resonance of the first and second copper coils 51, 52. The effect of electromagnetic induction of the intensified magnetic field around the second copper coil 52 generates power in a secondary coil 55. The generated power is then supplied to a load 56. It has been confirmed that, when first and second copper coils 51, 52 having a diameter of 30 cm were placed 2 m away from each other, 60-watt light as the load 56 was turned on.

To effectively supply output power of the alternating-current source 53 to the load 56 in this non-contact power transmission apparatus, it is necessary to efficiently supply the output power of the alternating-current source 53 to a resonance system (the first and second copper coils 51, 52 and the primary and secondary coils 54, 55). However, the above listed documents only schematically disclose non-contact power transmission apparatuses, but have no concrete description as to how to obtain a non-contact power transmission apparatus that satisfies such requirements.

SUMMARY

Accordingly, it is an objective of the present invention to provide a non-contact power transmission apparatus that efficiently supplies output power of an alternating-current source to a resonance system, and a method for designing such an apparatus.

To achieve the foregoing objective and in accordance with one aspect of the present invention, a non-contact power transmission apparatus comprising a resonance system is provided. The resonance system includes a primary coil to which an alternating-current voltage from an alternating-current source is applied, a primary-side resonance coil, a secondary-side resonance coil, and a secondary coil to which a load is connected. The impedance of the primary coil is set such that the output impedance of the alternating-current source and the input impedance of the resonance system are matched to each other.

In accordance with another aspect of the present invention, a method for designing a non-contact power transmission apparatus including a resonance system is provided. The resonance system includes a primary coil to which an alternating-current voltage from an alternating-current source is applied, a primary-side resonance coil, a secondary-side resonance coil, and a secondary coil to which a load is connected. The method includes: setting the frequency of the alternating-current voltage of the alternating-current source; and setting the impedance of the primary coil such that the output impedance of the alternating-current source and the input impedance of the resonance system are matched to each other at the set frequency.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF ILLUSTRATIVE EMBODIMENTS

A non-contact power transmission apparatus 10 according to one embodiment of the present invention will now be described with reference to FIGS. 1 to 4.

Figure 1:
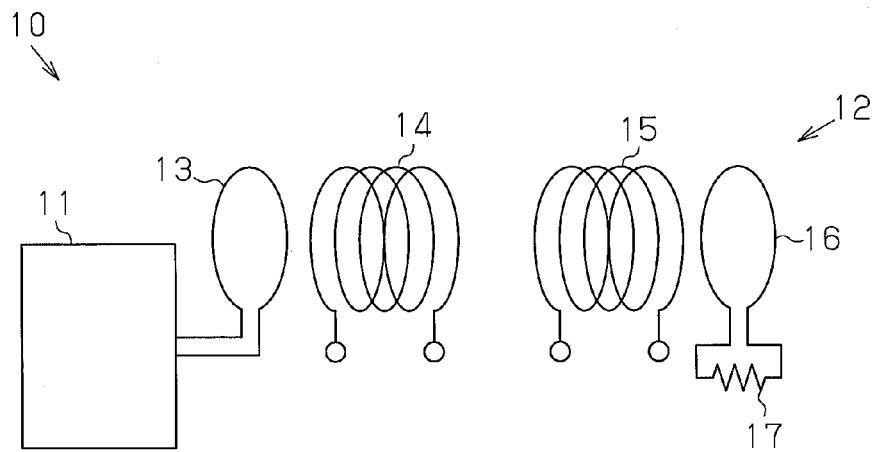
FIG. 1 is a schematic diagram of a non-contact power transmission apparatus according to one embodiment of the present invention.

As shown in FIG. 1, the non-contact power transmission apparatus 10 includes a resonance system 12, which transmits power supplied from an alternating-current source 11 to a load 17 without contact. The resonance system 12 includes a primary coil 13 connected to the alternating-current source 11, a primary-side resonance coil 14, a secondary-side resonance coil 15, and a secondary coil 16. The secondary coil 16 is connected to the load 17. The alternating-current source 11 supplies alternating-current voltage to the primary coil 13. The alternating-current source 11 may receive direct-current voltage supplied by a direct-current source, convert the direct-current voltage to an alternating-current voltage, and supply the alternating-current voltage to the primary coil 13.

The non-contact power transmission apparatus 10 applies alternating-current voltage from the alternating-current source 11 to the primary coil 13, thereby generating a magnetic field at the primary coil 13. The non-contact power transmission apparatus 10 intensifies the magnetic field generated at the primary coil 13 by means of magnetic field resonance of the primary-side resonance coil 14 and the secondary-side resonance coil 15, thereby generating power in the secondary coil 16 through the effect of electromagnetic induction of the intensified magnetic field around the secondary-side resonance coil 15. The generated power is then supplied to the load 17.

The primary coil 13, the primary-side resonance coil 14, the secondary-side resonance coil 15, and the secondary coil 16 are each formed by an electric wire. The diameter and the number of turns of each coil 13, 14, 15, 16 are suitably set in accordance with, for example, the intensity of the power to be transmitted. In the present embodiment, the primary coil 13, the primary-side resonance coil 14, the secondary-side resonance coil 15, and the secondary coil 16 have the same diameter.

The frequency of the alternating-current voltage outputted by the alternating-current source 11 can be arbitrarily changed. Accordingly, the frequency of the alternating-current voltage applied to the resonance system 12 can be changed freely.

A method for designing the non-contact power transmission apparatus 10 will now be described.

First, the specifications of the primary-side resonance coil 14 and the secondary-side resonance coil 15, which form the resonance system 12, are determined. In addition to the material of the electric wires forming the primary-side and secondary-side resonance coils 14, 15, the specifications include values that need to be determined when producing and installing the resonance coils 14, 15, such as the size of the wires, the diameter of the coils, the number of turns, the distance between the resonance coils 14, 15. Next, the specifications of the primary coil 13 and the secondary coil 16 are determined. In addition to the material of the electric wires forming the coils 13, 16, the specifications include the size of the wires, the diameter of the coils, and the number of turns. Normally, copper wires are used as the electric wires.

Then, in accordance with the determined specifications, the primary coil 13, the primary-side resonance coil 14, the secondary-side resonance coil 15, and the secondary coil 16 are formed, and the resonance system 12 is assembled. The load 17 is connected to the secondary coil 16. Subsequently, the input impedance Zin of the resonance system 12 is measured while changing the frequency of the alternating-current voltage of the alternating-current source 11 applied to the primary coil 13. The input impedance Zin of the resonance system 12 refers to the impedance of the entire resonance system 12 measured at both ends of the primary coil 13. Then, while changing the alternating current frequency of the alternating-current source 11 applied to the primary coil 13, the required power transmission characteristics of the resonance system 12, such as the power transmission efficiency and the transmitted power with respect to the frequency of the alternating-current voltage of the alternating-current source 11 are measured. A frequency of the alternating-current voltage of the alternating-current source 11 at which desired power transmission characteristics are obtained is set as a drive frequency.

Next, the impedance Z1 of the primary coil 13 is adjusted such that the output impedance of the alternating-current source 11 and the input impedance of the resonance system 12 are matched to each other at the drive frequency. Specifically, the diameter, the number of turns, and the space between the turns of the primary coil 13 are adjusted.

When matching the output impedance of the alternating-current source 11 and the input impedance of the resonance system 12 to each other, it is most preferably that the impedances are exactly equal to each other. However, for example, the input impedance of the resonance system 12 and the output impedance of the alternating-current source 11 are permitted to be different in a range where a desired performance as a non-contact power transmission apparatus is achieved, for example, in a range where the power transmission efficiency of the non-contact power transmission apparatus 10 is 80% or higher or in a range where the reflected power from the primary coil 13 to the alternating-current source 11 is 5% or lower. For example, the difference between the input impedance of the resonance system 12 and the output impedance of the alternating-current source 11 is permitted as long as the difference is within ±10% range, and preferably ±5% range relative to the output impedance of the alternating-current source 11. When the difference within the range, the impedances are deemed to be matched to each other.

The method for designing is based on findings of experiments by the inventors that the power transmission characteristics of the whole resonance system 12 are not influenced by the impedance of the primary coil 13. The design of the power transmission characteristics of the resonance system 12 and the matching of the output impedance of the alternating-current source 11 and the input impedance of the resonance system 12 can be executed independently from each other.

Figure 2:
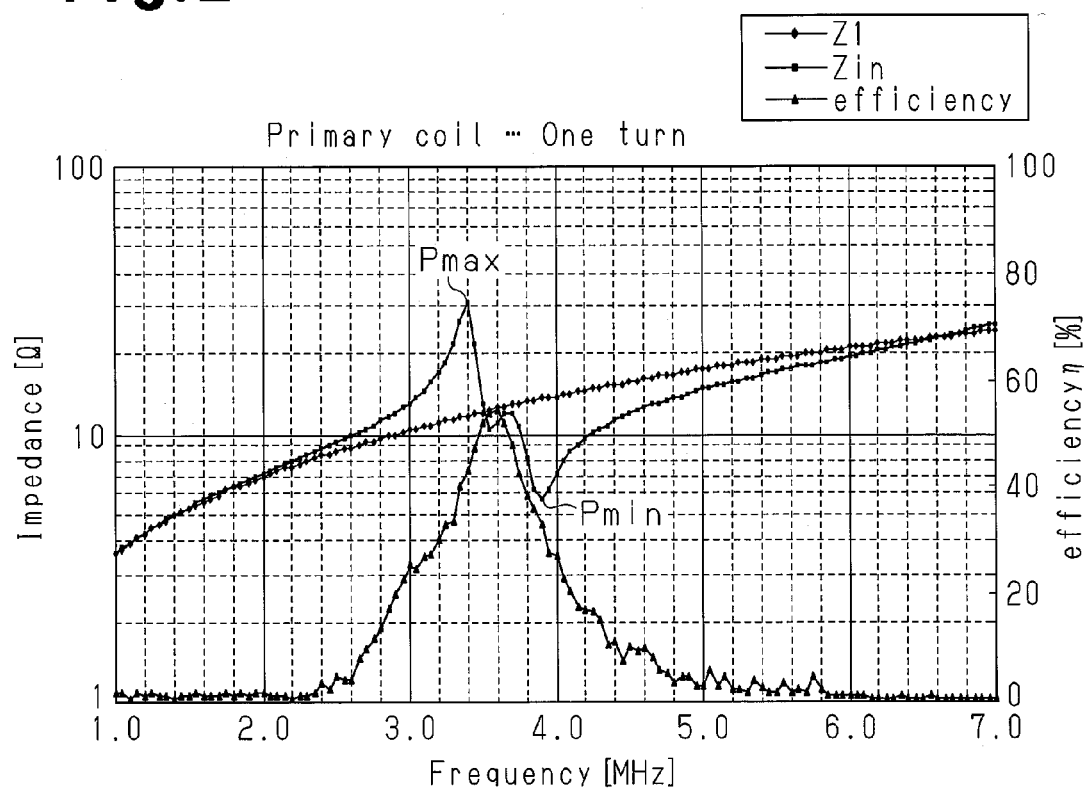
FIG. 2 is a graph showing the relationship among the impedance of a one-turn primary coil, the input impedance of the resonance system, the power transmission efficiency, and the frequency of the alternating-current voltage of an alternating-current source.
Figure 3:
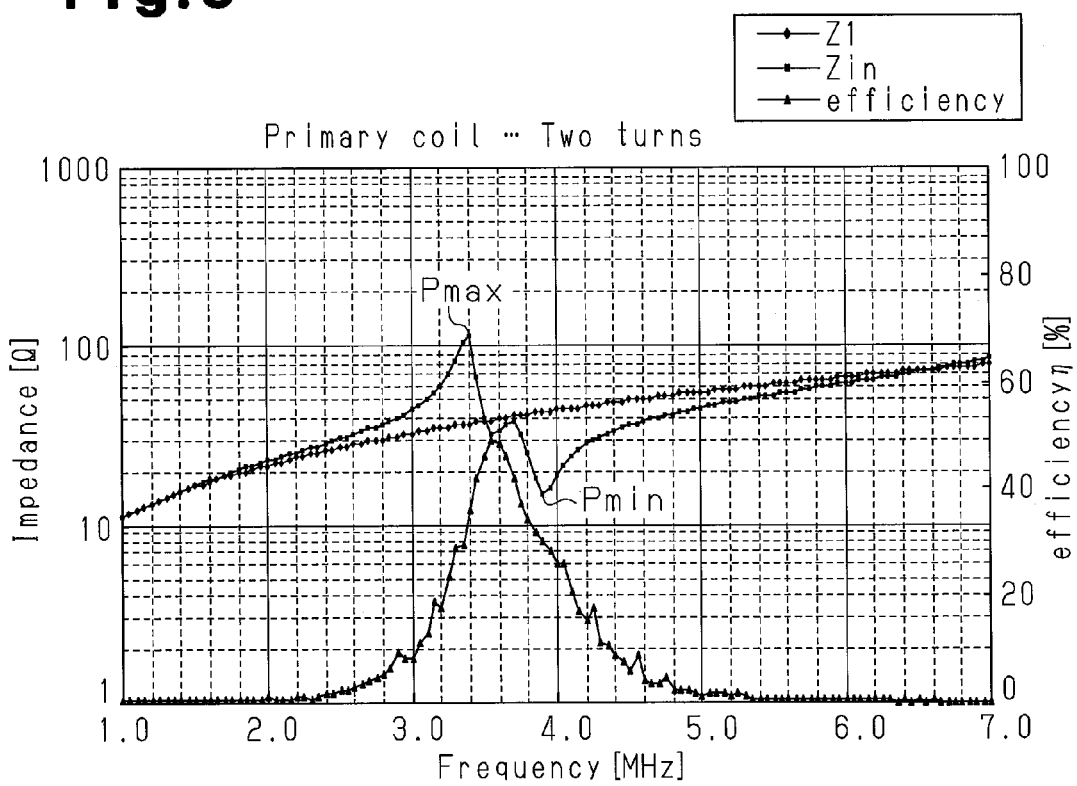
FIG. 3 is a graph showing the relationship among the impedance of a two-turn primary coil, the input impedance of the resonance system, the power transmission efficiency, and the frequency of the alternating-current voltage of an alternating-current source.
Figure 4:
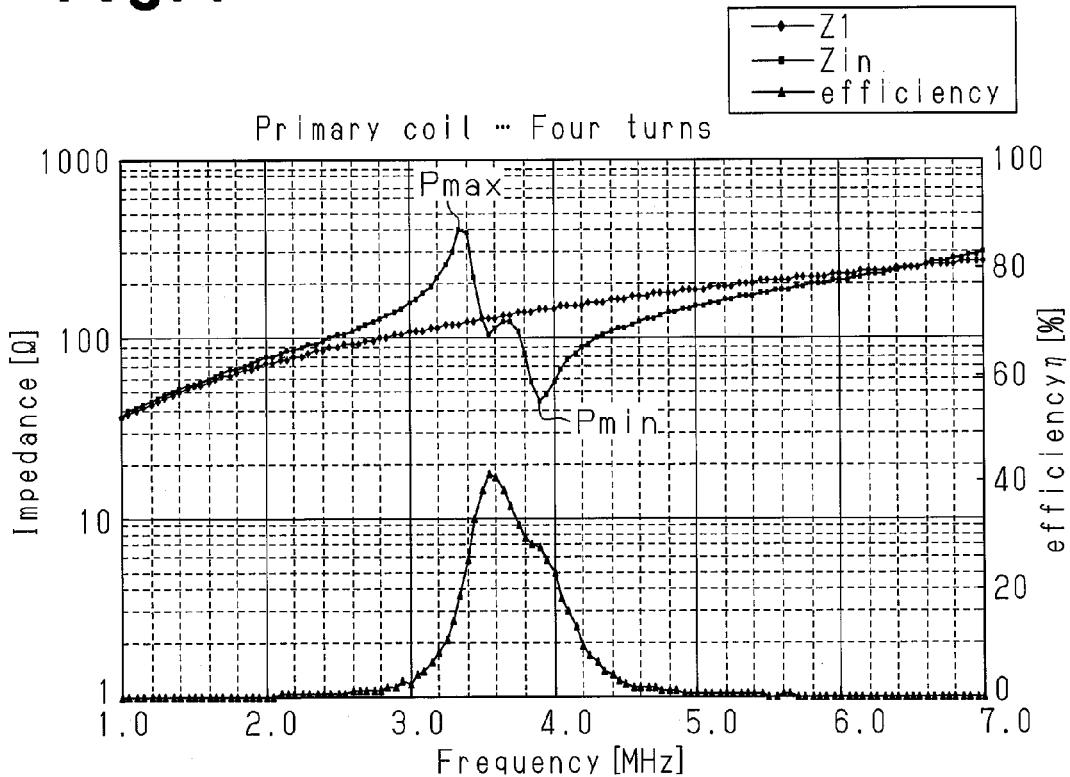
FIG. 4 is a graph showing the relationship among the impedance of a four-turn primary coil, the input impedance of the resonance system, the power transmission efficiency, and the frequency of the alternating-current voltage of an alternating-current source.

Each of the coils 13, 14, 15, and 16, which form the resonance system 12 is formed by a thin vinyl insulated low voltage wire for automobiles (AVS wire) having a size (cross-sectional area) of 0.5 sq (square mm) Also, the primary coil 13, the primary-side resonance coil 14, the secondary-side resonance coil 15, and the secondary coil 16 are formed in accordance with the following specifications:

The primary coil 13 and the secondary coil 16: number of turns . . . 2, diameter . . . 150 mm, closely wound The primary-side resonance coil 14 and the secondary-side resonance coil 15: number of turns . . . 45, diameter . . . 150 mm, closely wound, both ends open The distance between the primary-side resonance coil 14 and the secondary-side resonance coil 15: 200 mm A resistor of 50Ω serving as the load 17 is connected to the secondary coil 16, and a sine wave alternating current voltage of 10 Vpp (amplitude of 5 V) and frequency of 1 to 7 MHz was supplied as an input voltage to the primary coil 13 from the alternating-current source 11. Then, the impedance Z1 of the primary coil 13, the input impedance Zin of the resonance system 12, and the power transmission efficiency η were measured. To check the influence of the impedance Z1 of the primary coil 13 on the input impedance Zin of the resonance system 12 and the power transmission efficiency η, the number of turns of the primary coil 13 was changed to a single turn and four turns without changing the specifications of the coils other than the primary coil 13, and the measurement was performed on the resonance system 12 with the changed specifications. FIGS. 2, 3, and 4 show the results of the measurements. In FIGS. 2 to 4, the horizontal axis represents the frequency of the alternating current voltage of the alternating-current source 11, and the vertical axis represents the impedances Zin, Z1 and the power transmission efficiency η. In FIGS. 2 to 4, the power transmission efficiency η is simply shown as the efficiency η. The power transmission efficiency η is represents the ratio of the power consumption at the load 17 to the input power to the primary coil 13, and is obtained according to the following equation when expressed as a percent.

The power transmission efficiency η=(power consumption at the load 17)/(input power to the primary coil 13)×100[%]

FIGS. 2 to 4 suggest the following:

1. The impedance Z1 of the primary coil 13 is monotonically increased as the frequency of the alternating current voltage of the alternating-current source 11 is increased from 1 MHz to 7 MHz regardless of the number of turns of the primary coil 13. The lower the frequency, the higher the rate of increase of the impedance Z1 becomes.

2. The input impedance Zin of the resonance system 12 changes substantially in agreement with the impedance Z1 of the primary coil 13 in a range where the frequency of the alternating current voltage of the alternating-current source 11 is 2 MHz or lower and in a range where the frequency is 6 MHz or higher. In the vicinity of the resonance frequency, parallel resonance and series resonance subsequently occurs, so that the input impedance Zin of the resonance system 12 changed to create a local maximum point Pmax and a local minimum point Pmin.

3. The power transmission efficiency η has a maximum value substantially at the same frequency regardless of the number of turns of the primary coil 13. The frequency at which the power transmission efficiency η has the maximum value is defined as the resonance frequency of the resonance system 12.

4. The frequency at which the local maximum point Pmax and the local minimum point Pmin appear in the input impedance Zin of the resonance system 12 is substantially constant regardless of the number of turns of the primary coil 13.

5. When the frequency of the alternating current voltage of the alternating-current source 11 is set to a frequency between the frequency at which the local maximum point Pmax appears in the input impedance Zin of the resonance system 12 (the first frequency) and the frequency at which the local minimum point Pmin appears in the input impedance Zin of the resonance system 12 (the second frequency), the power transmission efficiency η is raised. Particularly, the power transmission efficiency η is maximized when the frequency of the alternating current voltage of the alternating-current source 11 is set to be close to a frequency that is between the frequency corresponding to the local maximum point Pmax and the local minimum point Pmin, and in which the input impedance Zin of the resonance system 12 is equal to the impedance Z1 of the primary coil 13.

6. The power transmission efficiency η is raised in an impedance decrease range where the input impedance Zin of the resonance system 12 is decreased as the frequency is increased. Particularly, the power transmission efficiency η is maximized in a range where the input impedance Zin of the resonance system 12 is decreased as the frequency is increased and at about the frequency at which the input impedance Zin of the resonance system 12 is equal to the impedance Z1 of the primary coil 13.

The present embodiment has the following advantages:

(1) The non-contact power transmission apparatus 10 has the resonance system 12, which includes the primary coil 13, which receives alternating-current voltage from the alternating-current source 11, the primary-side resonance coil 14, the secondary-side resonance coil 15, and the secondary coil 16, to which the load 17 is connected. The output impedance of the alternating-current source 11 and the input impedance Zin of the resonance system 12 are matched to each other. Power is thus efficiently supplied from the alternating-current source 11 to the resonance system 12. When matching the input impedance Zin of the resonance system 12 and the output impedance of the alternating-current source 11 to each other, it is sufficient to measure only the impedance Z1 of the primary coil 13 instead of the input impedance Zin of the resonance frequency 12. Therefore, the input impedances Zin of the resonance system 12 and the output impedances alternating-current source 11 are easily matched to each other.

(2) The alternating-current source 11 applies to the primary coil 13 an alternating current voltage of which the frequency is between the frequency corresponding to the local maximum point Pmax of the input impedance Zin in the resonance system 12 (the first frequency) and the frequency that corresponds to the local minimum point Pmin of the input impedance (the second frequency). Therefore, the power transmission efficiency η is raised. Particularly, the power transmission efficiency η is maximized when the primary coil 13 receives an alternating-current voltage the frequency of which is in the range between the first frequency and the second frequency and equalizes the input impedance Zin of the resonance system 12 and the impedance Z1 of the primary coil 13 to each other.

(3) The alternating-current source 11 applies to the primary coil 13 an alternating-current voltage the frequency of which is in an impedance decrease range where the input impedance Zin of the resonance system 12 is decreased as the frequency is increased. Therefore, the power transmission efficiency η is raised. Particularly, the power transmission efficiency η is maximized when the primary coil 13 receives an alternating-current voltage the frequency of which is in the range set in the above described manner and equalizes the input impedance Zin of the resonance system 12 and the impedance Z1 of the primary coil 13 to each other.

(4) The resonance frequency of the resonance system 12 remains unchanged even if the impedance Z1 of the primary coil 13 is changed. Therefore, only by adjusting the impedance Z1 of the primary coil 13, the output impedance of the alternating-current source 11 and the input impedance Zin of the resonance system 12 can be matched to each other without changing the resonance frequency. Accordingly, the design and adjustment of the non-contact power transmission apparatus 10 are facilitated.

(5) The primary coil 13, the primary-side resonance coil 14, the secondary-side resonance coil 15, and the secondary coil 16 have the same diameter. Therefore, the primary coil 13 and the primary-side resonance coil 14 can be easily produced by winding the coils 13, 14 around a single cylinder, and the secondary-side resonance coil 15 and the secondary coil 16 can be easily produced by winding the coils 15, 16 around a single cylinder.

(6) The non-contact power transmission apparatus 10 is designed in the following manner. That is, the frequency of an alternating-current voltage that the alternating-current source 11 applies to the primary coil 13 is set. Then, the impedance Z1 of the primary coil 13 is set such that the output impedance of the alternating-current source 11 and the input impedance Zin of the resonance system 12 are matched to each other at the drive frequency. At this time, the power transmission characteristics of the resonance system 12 are not changed even if the impedance Z1 of the primary coil 13 is changed. Thus, after the output impedance of the alternating-current source 11 and the input impedance Zin of the resonance system 12 are matched to each other, the alternating current frequency of the resonance system 12 and the alternating-current source 11 do not need to be adjusted again. It is thus possible to provide the non-contact power transmission apparatus 10 that efficiently supplies power from the alternating-current source 11 to the resonance system 12. The output impedance of the alternating-current source 11 and the input impedance Zin of the resonance system 12 are easily matched to each other.

The present invention is not limited to the above embodiment, but may be modified as follows.

When needed, the impedance Z1 of the primary coil 13 can be adjusted by changing the number of turns of the primary coil 13, the diameter of the coil 13, the size of the electric wire of the primary coil 13, or the material of the electric wire of the primary coil 13. However, the easiest way is to change the number of turns and the diameter of the coil.

When forming the coils 13, 14, 15, 16 by winding electric wires, the coils 13, 14, 15, 16 do not need to be cylindrical. For example, the coils may have a tubular shape with a simple cross-sectional shape such as a polygon including a triangle, a rectangle, and a hexagon. The coils may also have a cross-section of an asymmetrical figure.

Figure 5:
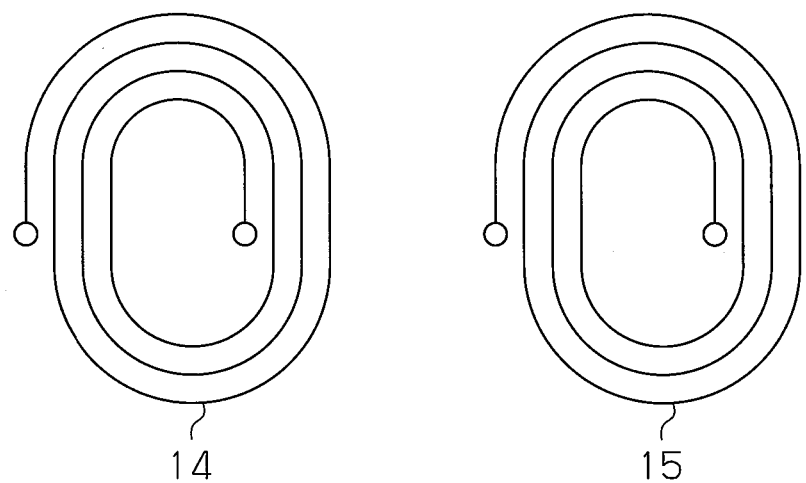
FIG. 5 is a diagram showing a modified embodiment of a primary-side resonance coil and a secondary-side resonance coil, which form a resonance system.
Figure 6:
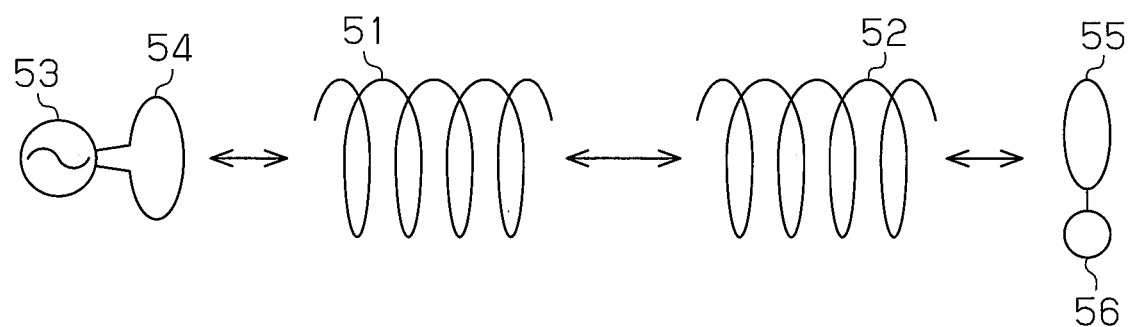
FIG. 6 is a schematic diagram showing a prior art non-contact power transmission apparatus.

The primary-side resonance coil 14 and the secondary-side resonance coil 15 are not limited to coils formed by winding an electric wire into a cylindrical shape, but may be formed by winding an electric wire into a spiral in a single plane as shown in FIG. 5.

The coils 13, 14, 15, and 16 may be configured such that an electric wire is closely wound so that each turn contacts the adjacent turn, or may be configured such that the electric wire is wound with a space between each adjacent pair of turns.

The primary coil 13, the primary-side resonance coil 14, the secondary-side resonance coil 15, and the secondary coil 16 do not need to have the same diameter. For example, the primary-side resonance coil 14 and the secondary-side resonance coil 15 may have the same diameter, and the primary coil 13 and the secondary coil 16 may be different from each other. Alternatively, the primary and secondary coils 13, 16 may have a different diameter from the diameter of the primary-side and secondary-side resonance coils 14, 15.

The method for designing the non-contact power transmission apparatus 10 is not limited to the one in which, after the specification so the primary-side resonance coil 14 and the secondary-side resonance coil 15, forming the resonance system 12, are set, the specification of the alternating-current source 11 is set, and then the impedance Z1 of the primary coil 13 is set such that the output impedance of the alternating-current source 11 and the input impedance Zin of the resonance system 12 are matched to each other. For example, the specification of the alternating-current source 11 may be set first, and, in accordance with the specification of the alternating-current source 11, the specification of the primary-side resonance coil 14 and the secondary-side resonance coil 15, which form the resonance system 12, and the impedance Z1 of the primary coil 13 may be set. Setting the specification of the alternating-current source 11 prior to the specification of the resonance system 12 means that, after the resonance frequency is determined when setting the specification of the resonance system 12, the material and the size of the electric wires forming the primary-side resonance coil 14 and the secondary-side resonance coil 15, the diameter of the coils, the number of turns, the distance between the resonance coils 14, 15 are determined.

What is claimed:

1. A non-contact power transmission apparatus comprising a resonance system, which includes a primary coil to which an alternating-current voltage from an alternating-current source is applied, a primary-side resonance coil, a secondary-side resonance coil, and a secondary coil to which a load is connected,
    wherein the impedance of the primary coil is set such that the output impedance of the alternating-current source and the input impedance of the resonance system are matched to each other.

2. The apparatus according to claim 1, wherein, when the input impedance of the resonance system and the frequency of the alternating-current voltage are plotted on a graph, the frequency of the alternating-current voltage of the alternating current source is in a range between a first frequency, at which the input impedance of the resonance system has a local maximum value, and a second frequency, at which the input impedance of the resonance system has a local minimum value.

3. The apparatus according to claim 1, wherein the frequency of the alternating-current voltage of the alternating current source is set in an impedance decrease range, where the input impedance of the resonance system is decreased as the frequency of the alternating-current voltage is increased.

4. A method for designing a non-contact power transmission apparatus including a resonance system, which includes a primary coil to which an alternating-current voltage from an alternating-current source is applied, a primary-side resonance coil, a secondary-side resonance coil, and a secondary coil to which a load is connected; the method comprising:
    setting the frequency of the alternating-current voltage of the alternating-current source; and
    setting the impedance of the primary coil such that the output impedance of the alternating-current source and the input impedance of the resonance system are matched to each other at the set frequency.

5. The designing method according to claim 4, wherein, when the input impedance of the resonance frequency and the frequency of the alternating-current voltage are plotted on a graph, the frequency of the alternating-current voltage of the alternating current source is in a range between a first frequency, at which the input impedance of the resonance system has a local maximum value, and a second frequency, at which the input impedance of the resonance system has a local minimum value.

6. The designing method according to claim 4, wherein the frequency of the alternating-current voltage of the alternating current source is set in an impedance decrease range, where the input impedance of the resonance system is decreased as the frequency of the alternating-current voltage is increased.

* * * * *